United States Patent
Lim et al.

(10) Patent No.: US 12,477,875 B2
(45) Date of Patent: Nov. 18, 2025

(54) LIGHT EMITTING DIODE (LED) PACKAGE HAVING REFLECTION MOLDING LAYER COVERING LED CHIP

(71) Applicant: SAMSUNG ELECTRONICS CO., LTD., Suwon-si (KR)

(72) Inventors: Jongho Lim, Suwon-si (KR); Jaehyuk Lim, Hwaseong-si (KR); Hosik Jun, Hwaseong-si (KR); Hyojeong Kang, Hwaseong-si (KR); Yonggi Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 534 days.

(21) Appl. No.: 17/943,299

(22) Filed: Sep. 13, 2022

(65) Prior Publication Data
US 2023/0155086 A1 May 18, 2023

(30) Foreign Application Priority Data
Nov. 16, 2021 (KR) .................. 10-2021-0158037

(51) Int. Cl.
| | |
|---|---|
| *H10H 20/856* | (2025.01) |
| *H01L 25/16* | (2023.01) |
| *H10H 20/01* | (2025.01) |
| *H10H 20/851* | (2025.01) |
| *H10H 20/855* | (2025.01) |

(52) U.S. Cl.
CPC ......... *H10H 20/856* (2025.01); *H01L 25/167* (2013.01); *H10H 20/01* (2025.01); *H10H 20/851* (2025.01); *H10H 20/855* (2025.01); *H10H 20/0361* (2025.01); *H10H 20/0363* (2025.01)

(58) Field of Classification Search
CPC . H10H 20/851; H10H 20/0361; H01L 25/167
USPC .............................................. 257/98
See application file for complete search history.

(56) References Cited

U.S. PATENT DOCUMENTS

| | | | |
|---|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |

(Continued)

FOREIGN PATENT DOCUMENTS

| | | |
|---|---|---|
| CN | 104124237 A | 10/2014 |
| CN | 205488198 U | 8/2016 |

(Continued)

*Primary Examiner* — Eliseo Ramos Feliciano
*Assistant Examiner* — Mikka Liu
(74) *Attorney, Agent, or Firm* — Muir Patent Law, PLLC

(57) ABSTRACT

A light-emitting diode (LED) package includes a substrate including an insulating material; upper pads on an upper surface of the substrate; a side surface molding layer covering the upper surface of the substrate and side surfaces of the upper pads; an LED chip on the upper surface of the substrate and electrically connected to the upper pads; a fluorescent layer on the LED chip; and a reflection molding layer on the substrate and covering the LED chip, the reflection molding layer including white silicon, wherein the reflection molding layer exposes a portion of side surfaces of the fluorescent layer.

20 Claims, 26 Drawing Sheets

(56) References Cited

U.S. PATENT DOCUMENTS

| | | |
|---|---|---|
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,772,609 B2 | 8/2010 | Yan |
| 7,781,727 B2 | 8/2010 | Sherrer et al. |
| 7,790,482 B2 | 9/2010 | Han et al. |
| 7,821,023 B2 | 10/2010 | Yuan et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 9,449,954 B2 | 9/2016 | Lin et al. |
| 9,786,825 B2 | 10/2017 | Hussell |
| 2015/0236203 A1* | 8/2015 | Oh ............... H10H 20/853 438/27 |
| 2018/0261572 A1 | 9/2018 | Hung et al. |
| 2019/0044039 A1* | 2/2019 | Lee ............... H10H 20/858 |
| 2019/0088824 A1* | 3/2019 | Kim ............... H10H 20/8515 |
| 2020/0105972 A1* | 4/2020 | Dimitropoulos .... H01L 25/0753 |
| 2022/0069172 A1* | 3/2022 | Weare ............... H10H 20/8512 |

FOREIGN PATENT DOCUMENTS

| | | |
|---|---|---|
| CN | 109509827 B | 6/2020 |
| JP | 5973355 B2 | 8/2016 |
| KR | 10-1068651 B1 | 9/2011 |
| KR | 1020190031094 A | 3/2019 |

\* cited by examiner

LIGHT EMITTING DIODE (LED) PACKAGE HAVING REFLECTION MOLDING LAYER COVERING LED CHIP

CROSS-REFERENCE TO RELATED APPLICATION

This application is based on and claims priority under 35 U.S.C. § 119 to Korean Patent Application No. 10-2021-0158037, filed on Nov. 16, 2021, in the Korean Intellectual Property Office, the disclosure of which is incorporated by reference herein in its entirety.

BACKGROUND

1. Field

Embodiments relate to a light emitting diode (LED) package.

2. Description of the Related Art

LED chips and LED packages including LED chips may have various advantages such as a low power consumption, high brightness, and a long lifespan, and gradually their application as light sources has expanded. An example of using LED packages as a light source may include their use as headlights of a vehicle.

SUMMARY

The embodiments may be realized by providing a light-emitting diode (LED) package including a substrate including an insulating material; upper pads on an upper surface of the substrate; a side surface molding layer covering the upper surface of the substrate and side surfaces of the upper pads; an LED chip on the upper surface of the substrate and electrically connected to the upper pads; a fluorescent layer on the LED chip; and a reflection molding layer on the substrate and covering the LED chip, the reflection molding layer including white silicon, wherein the reflection molding layer exposes a portion of side surfaces of the fluorescent layer.

The embodiments may be realized by providing a light-emitting diode (LED) package including a substrate; lower pads on a lower surface of the substrate; upper pads on an upper surface of the substrate; an LED chip on the upper surface of the substrate and electrically connected to the upper pads; a fluorescent layer on the LED chip; a reflection molding layer on the substrate and covering the LED chip, the reflection molding layer including white silicon; and a side surface molding layer covering a portion of the upper surface of the substrate, side surfaces of the upper pads, and side surfaces of the lower pads, the side surface molding layer including a cup portion horizontally surrounding the LED chip, the fluorescent layer, and the reflection molding layer, wherein an upper surface of the cup portion is farther from the substrate in a vertical direction than an upper surface of the fluorescent layer is from the substrate in the vertical direction, and an internal surface of the side surface molding layer that faces the LED chip is outwardly inclined with respect to the upper surface of the substrate.

The embodiments may be realized by providing a light-emitting diode (LED) package including a substrate including aluminum oxide; upper pads on an upper surface of the substrate; an LED chip on the upper surface of the substrate and electrically connected to the upper pads; a fluorescent layer on the LED chip, the fluorescent layer including phosphor-in-glass (PiG); a side surface molding layer covering a portion of the upper surface of the substrate and side surfaces of the upper pads, the side surface molding layer including a cup portion horizontally surrounding the LED chip and the fluorescent layer; and a reflection molding layer covering the LED chip and inside surfaces of the cup portion of the side surface molding layer, the reflection molding layer exposing at least a portion of side surfaces of the fluorescent layer, wherein an upper surface of the reflection molding layer is inclined with respect to the upper surface of the substrate such that the inclined upper surface of the reflection molding layer has a structure in which a portion of the upper surface of the reflection molding layer distal to the LED chip is farther from the upper surface of the substrate in a vertical direction than a portion of the upper surface of the reflection molding layer proximate to the LED chip is from the upper surface of the substrate in the vertical direction.

BRIEF DESCRIPTION OF THE DRAWINGS

Features will be apparent to those of skill in the art by describing in detail exemplary embodiments with reference to the attached drawings in which.

DETAILED DESCRIPTION

Figure 1A:
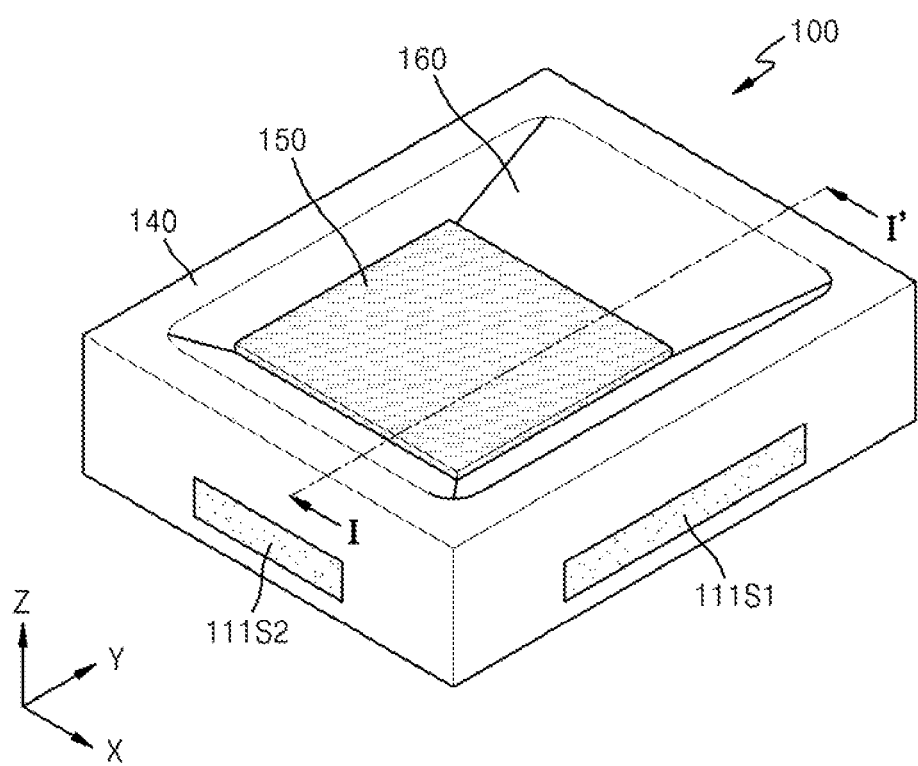
FIGS. 1A through 1C are perspective views of a light-emitting diode (LED) package according to example embodiments.
Figure 1B:
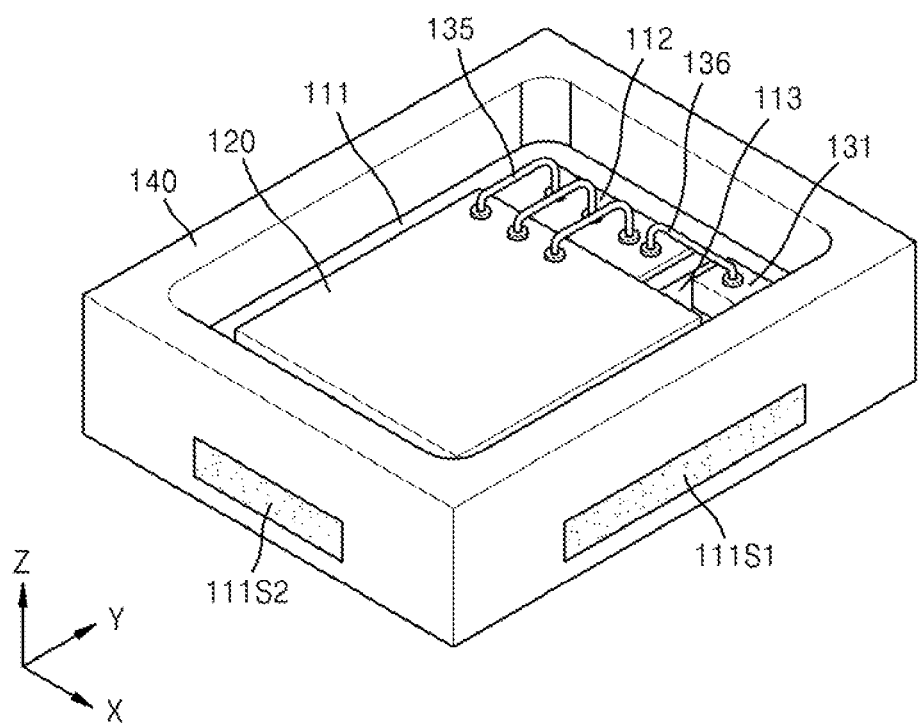
Figure 1C:
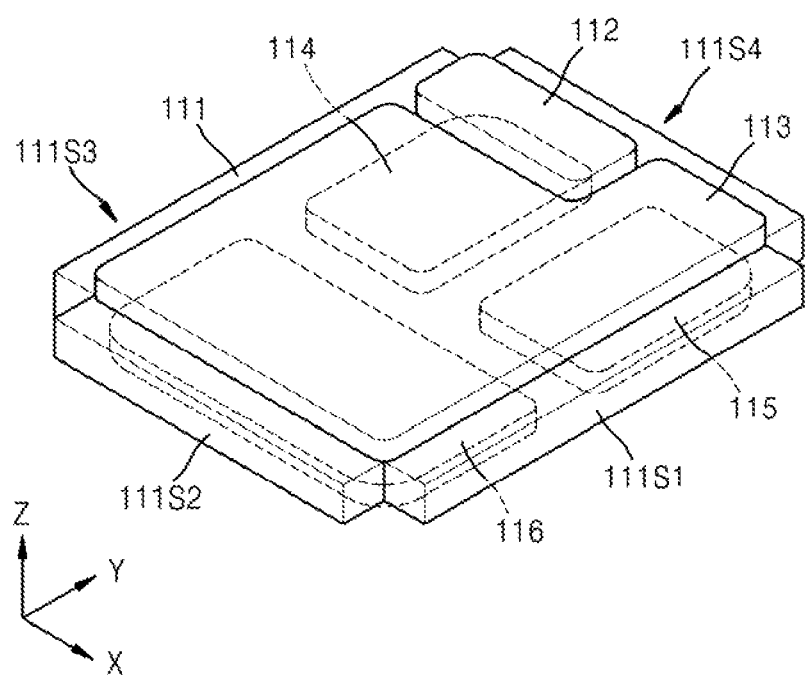

FIGS. 1A through 1C are perspective views of a light emitting diode (LED) package 100 according to example embodiments.

FIG. 1A illustrates the LED package 100, FIG. 1B illustrates the LED package 100, in which a fluorescent layer 150 and a reflection molding layer 160 are omitted, and FIG. 1C illustrates a substrate 111, upper pads 112 and 113, and lower pads 114, 115, and 116.

Figure 2A:
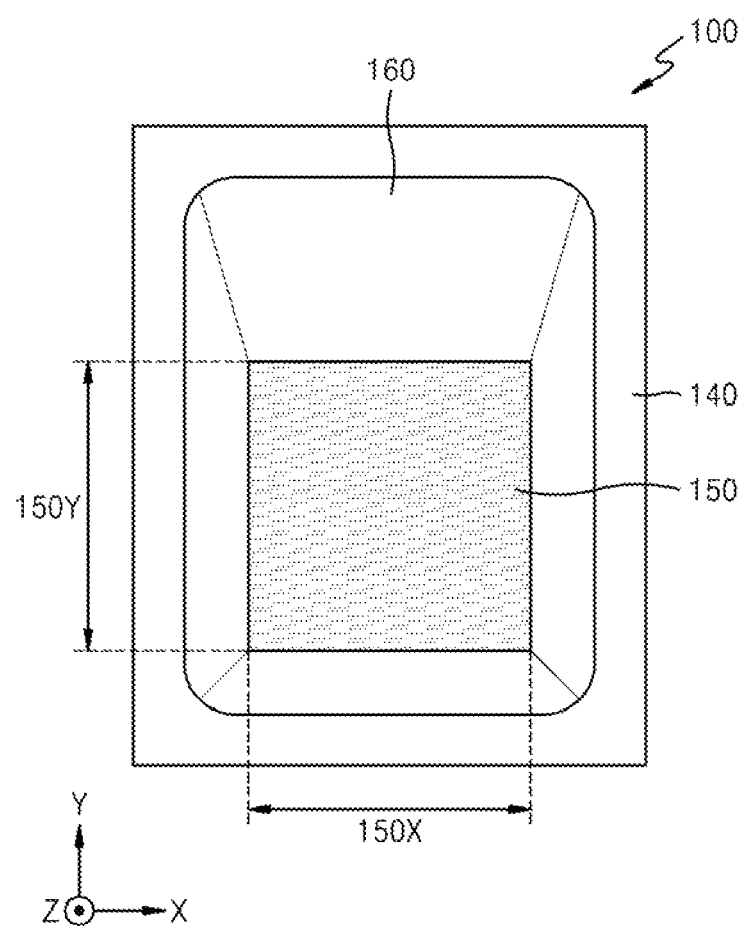
FIG. 2A is a top view of an LED package according to an example embodiment.

FIG. 2A is a top view of the LED package 100 according to an example embodiment.

Figure 2B:
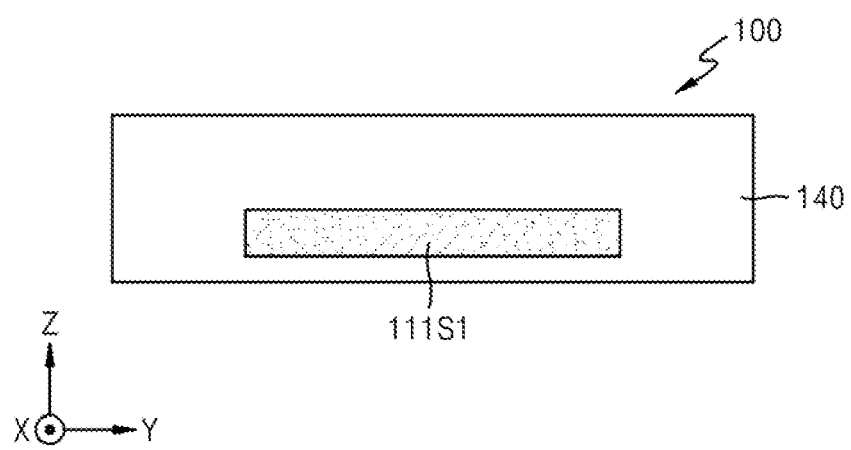
FIG. 2B is a side view of an LED package according to an example embodiment.

FIG. 2B is a side view of the LED package 100 according to an example embodiment.

Figure 2C:
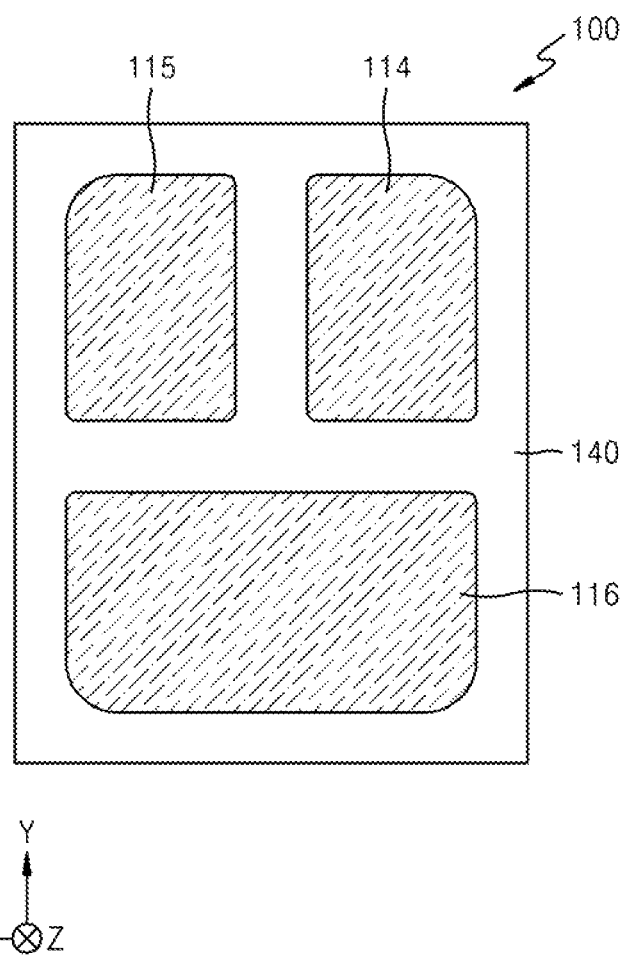
FIG. 2C is a bottom view of an LED package according to an example embodiment.

FIG. 2C is a bottom view of the LED package 100 according to an example embodiment.

Figure 2D:
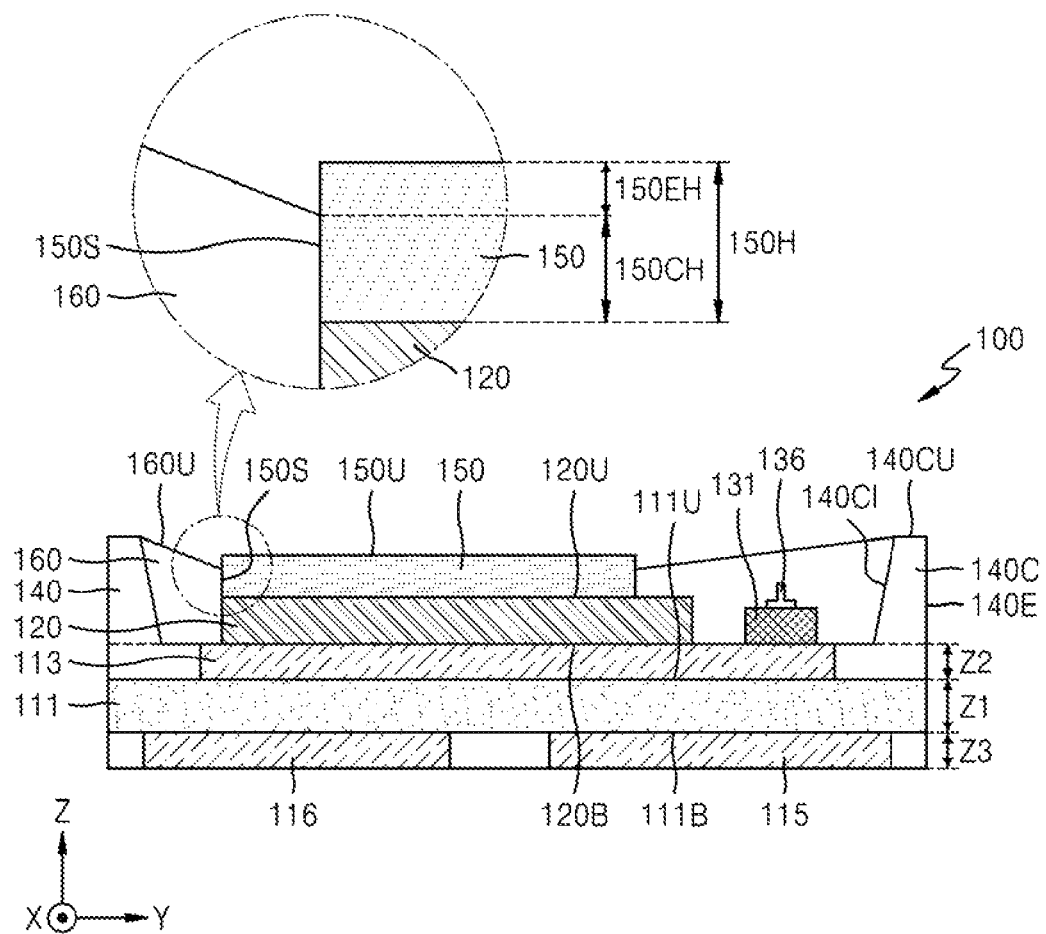
FIG. 2D is a cross-sectional view taken along line I-I' in FIG. 1A.

FIG. 2D is a cross-sectional view taken along line I-I' in FIG. 1.

Referring to FIGS. 1A through 2D, the LED package 100 may generate light based on an external power. Light generated by the LED package 100 may have a wavelength of a visible ray band. In an implementation, the LED package 100 may include a light source of a lighting device.

The LED package 100 may have a roughly cuboid shape. The LED package 100 may include two surfaces substantially vertical to an X direction, two surfaces substantially vertical to a Y direction, and two surfaces substantially vertical to a Z direction.

The X direction and the Y direction may include two directions substantially in parallel with an upper surface 111U of a substrate 111, and the Z direction may include a direction substantially vertical to the upper surface 111U of the substrate 111. The X direction, the Y direction, and the Z direction may be substantially vertical to each other.

The LED package 100 may include a substrate 111, the upper pads 112 and 113, the lower pads 114, 115, and 116, an LED chip 120, a Zener diode 131, wirings 135 and 136, a side surface molding layer 140, a fluorescent layer 150, and a reflection molding layer 160.

In an implementation, the substrate 111 may include an insulating material. In an implementation, the substrate 111 may include aluminum oxide. In an implementation, the substrate 111 may include $Al_2O_3$. In an implementation, by providing the substrate 111 including aluminum oxide, a fabricating cost of the LED package 100 may be reduced.

In an implementation, the substrate 111 may also include aluminum nitride. In an implementation, the substrate 111 may include AlN.

In an implementation, the substrate 111 may have a flat plate shape. In an implementation, the substrate 111 may include the upper surface 111U and a lower surface 111B, which include substantially flat surfaces. The substrate 111 may include a first side surface 111S1 between the upper surface 111U and the lower surface 111B, a second side surface 111S2, a third side surface 111S3, and a fourth side surface 111S4. The first and third side surfaces 111S1 and 111S3 may be vertical to the X direction, and the second and fourth side surfaces 111S2 and 111S4 may be vertical to the Y direction.

In an implementation, a Z direction thickness Z1 of the substrate 111 may be in a range of 0.1 mm to 0.2 mm. In an implementation, the Z direction thickness Z1 of the substrate 111 may be equal to or greater than about 0.11 mm. In an implementation, the Z direction thickness Z1 of the substrate 111 may be equal to or greater than about 0.12 mm. In an implementation, the Z direction thickness Z1 of the substrate 111 may be equal to or greater than about 0.13 mm. In an implementation, the Z direction thickness Z1 of the substrate 111 may be equal to or greater than about 0.14 mm. In an implementation, the Z direction thickness Z1 of the substrate 111 may be equal to or greater than about 0.15 mm. In an implementation, the Z direction thickness Z1 of the substrate 111 may be equal to or greater than about 0.16 mm. In an implementation, the Z direction thickness Z1 of the substrate 111 may be equal to or greater than about 0.17 mm. In an implementation, the Z direction thickness Z1 of the substrate 111 may be equal to or greater than about 0.18 mm. In an implementation, the Z direction thickness Z1 of the substrate 111 may be equal to or greater than about 0.19 mm.

In an implementation, by providing the substrate 111 with the Z direction thickness Z1 equal to or greater than about 0.1 mm, mechanical rigidity of the substrate 111 may be prevented from being extremely weakened.

In an implementation, by maintaining the Z direction thickness Z1 of the substrate 111 including a material having a relatively low thermal conductivity to be as equal to or less than about 0.2 mm, a thermal resistance increase of the LED package 100 may be prevented, and accordingly, heat dissipation efficiency of the LED package 100 may be enhanced. In addition, by reducing lengths of electrical paths between the upper pads 112 and 113 and lower pads 114 and 115, respectively, a driving voltage of the LED package 100 may be reduced. Furthermore, due to thickness reduction of the substrate 111, solder stress occurring on a printed circuit board in a process of mounting the LED package 100 may be mitigated.

In an implementation, a Z direction thickness Z2 of the upper pads 112 and 113 may be in a range of 0.06 mm to 0.15 mm. In an implementation, the Z direction thickness Z2 of the upper pads 112 and 113 may be equal to or greater than about 0.07 mm. In an implementation, the Z direction thickness Z2 of the upper pads 112 and 113 may be equal to or less than about 0.14 mm. In an implementation, the Z direction thickness Z2 of the upper pads 112 and 113 may be equal to or less than about 0.13 mm. In an implementation, the Z direction thickness Z2 of the upper pads 112 and 113 may be equal to or less than about 0.12 mm. In an implementation, the Z direction thickness Z2 of the upper pads 112 and 113 may be equal to or less than about 0.11 mm. In an implementation, the Z direction thickness Z2 of the upper pads 112 and 113 may be equal to or less than about 0.10 mm. In an implementation, the Z direction thickness Z2 of the upper pads 112 and 113 may be equal to or less than about 0.09 mm. In an implementation, the Z direction thickness Z2 of the upper pads 112 and 113 may be equal to or less than about 0.08 mm.

In an implementation, by providing the upper pads 112 and 113 having the Z direction thickness Z2 equal to or greater than 0.06 mm, cracks in the side surface molding layer 140, which could otherwise occur when a thickness of a portion of the side surface molding layer 140 arranged between the upper pads 112 and 113 is extremely thin, may be prevented. In addition, because relative thickness ratios of the upper pads 112 and 113 with respect to the substrate 111 are sufficiently large, equivalent thermal resistance of the entirety of the substrate 111 and the upper pads 112 and 113 may be reduced.

In an implementation, by providing the upper pads 112 and 113 having the Z direction thickness Z2 equal to or less than about 0.15 mm, the thickness of the LED package 100 may be prevented from being extremely large, and fabricating cost of the LED package 100 may be reduced.

In an implementation, a Z direction thickness Z3 of the lower pads 114, 115, and 116 may be in a range of 0.06 mm to 0.15 mm. In an implementation, the Z direction thickness Z3 of the lower pads 114, 115, and 116 may be equal to or greater than about 0.07 mm. In an implementation, the Z direction thickness Z3 of the lower pads 114, 115, and 116 may be equal to or less than about 0.14 mm. In an implementation, the Z direction thickness Z3 of the lower pads 114, 115, and 116 may be equal to or less than about 0.13 mm. In an implementation, the Z direction thickness Z3 of the lower pads 114, 115, and 116 may be equal to or less than about 0.12 mm. In an implementation, the Z direction thickness Z3 of the lower pads 114, 115, and 116 may be equal to or less than about 0.11 mm. In an implementation, the Z direction thickness Z3 of the lower pads 114, 115, and 116 may be equal to or less than about 0.10 mm. In an implementation, the Z direction thickness Z3 of the lower pads 114, 115, and 116 may be equal to or less than about 0.09 mm. In an implementation, the Z direction thickness Z3 of the lower pads 114, 115, and 116 may be equal to or less than about 0.08 mm.

In an implementation, by providing the lower pads 114, 115, and 116 having the Z direction thickness Z3 equal to or greater than about 0.06 mm, cracks in the side surface molding layer 140, which could otherwise occur when the thickness of the side surface molding layer 140 arranged between the lower pads 114, 115, and 116 is extremely small, may be prevented. In addition, by maintaining a relative thickness ratio of the lower pads 114, 115, and 116 with respect to the substrate 111 to be sufficiently large, equivalent thermal resistance of the entirety of the substrate 111 and the lower pads 114, 115, and 116 may be reduced.

In an implementation, by providing the lower pads 114, 115, and 116 having the Z direction thickness Z3 equal to or less than about 0.15 mm, the thickness of the LED package 100 may be prevented from being extremely large, and fabricating cost of the LED package 100 may be reduced.

A planar shape of the substrate 111, e.g., shapes of the upper surface 111U and the lower surface 111B may have a chamfered rectangular shape. In an implementation, the planar shape of the substrate 111, e.g., the shapes of the upper surface 111U and the lower surface 111B may have a rectangular shape, in which corner portions thereof are removed (e.g., a rectangle in which corners thereof are recessed). In an implementation, the planar shape of the substrate 111, e.g., the shapes of the upper surface 111U and the lower surface 111B may have a cross shape. In an implementation, the substrate 111 may have a rectangular planar shape, in which a corner portion between the first side surface 111S1 and the second side surface 111S2, a corner portion between the second side surface 111S2 and the third side surface 111S3, a corner portion between the third side surface 111S3 and the fourth side surface 111S4, and a corner portion between the fourth side surface 111S4 and the first side surface 111S1 are removed or recessed. The corner portions of the substrate 111 may be removed to provide paths for forming the side surface molding layer 140 in a molding process of fabricating the LED package 100.

The upper pads 112 and 113 and the lower pads 114, 115, and 116 may include a conductive material. In an implementation, the upper pads 112 and 113 and the lower pads 114, 115, and 116 may include a metal. In an implementation, the upper pads 112 and 113 and the lower pads 114, 115, and 116 may include copper (Cu).

The upper pads 112 and 113 may be on the upper surface 111U of the substrate 111, and the lower pads 114, 115, and 116 may be under or on the lower surface 111B of the substrate 111. In an implementation, through vias penetrating the substrate 111 may connect the upper pad 112 to the lower pad 114, and connect the upper pad 113 to the lower pad 115. When the LED package 100 is mounted in a printed circuit board such as a lighting device, the lower pads 114 and 115 may be electrically connected to the printed circuit board.

The lower pad 116 may be insulated from the upper pads 112 and 113. The lower pad 116 may be configured to be electrically floating. The lower pad 116 may include a heat conductive pad for dissipating heat generated by the LED package 100.

The LED chip 120 may be mounted on the substrate 111. The LED chip 120 may be electrically connected to the upper pads 112 and 113. An anode of the LED chip 120 may be connected to the upper pad 112, and a cathode of the LED chip 120 may be connected to the upper pad 113. Accordingly, the upper pads 112 and 113 and the lower pads 114 and 115 may provide a path for providing a driving power to the LED chip 120.

The cathode of the LED chip 120 may be on a lower surface 120B of the LED chip 120. The cathode of the LED chip 120 may form a eutectic bonding with the upper pad 113, or may be connected to the upper pad 113 by using a soldering process. The anode of the LED chip 120 may be formed on an upper surface 120U of the LED chip 120. The anode of the LED chip 120 may be connected to the upper pad 112 via the wirings 135.

According to an embodiment, the anode and the cathode may be on the upper surface 120U of the LED chip 120, and the anode and the cathode may be respectively attached to the upper pads 112 and 113 via the wirings 135. In an implementation, each of the anode and the cathode may be on the lower surface 120B of the LED chip 120, and the anode and the cathode may be respectively connected to the upper pads 112 and 113 by using any one of an eutectic bonding process and a soldering process.

The LED chip 120 may include a semiconductor layer of a first conductivity type, an active layer, and a semiconductor layer of a second conductivity type. In an implementation, a semiconductor layer of a first conductivity type may include monocrystalline nitride having a combination of $Al_xIn_yGa_{1-x-y}N$ ($0 \leq x \leq 1$, $0 \leq y \leq 1$, $0 \leq x+y \leq 1$). A semiconductor layer of a first conductivity type may include a semiconductor, on which n-type impurities are doped. In an implementation, a semiconductor layer of a first conductivity type may include gallium nitride (GaN), on which Si or the like is doped.

An active layer may be on a semiconductor layer of a first conductivity type. An active layer may emit light, that has certain energy by using a recombination process of electrons and holes. In an implementation, an active layer may include a multiple quantum well (MQW) structure, in which quantum well layers and quantum barrier layers are alternately stacked. In this case, a thickness of each of the quantum well layers and the quantum barrier layers may be in a range of 3 nm to 10 nm. In an implementation, the MQW structure may include a multiple stacked structure of indium gallium nitride (InGaN) and GaN. In an implementation, an active layer may have a single quantum well (SQW) structure.

A semiconductor material layer of a second conductivity type may include monocrystalline nitride having a combination of $Al_xIn_yGa_{1-x-y}N$ ($0 \leq x \leq 1$, $0 \leq y \leq 1$, $0 \leq x+y \leq 1$). P-type impurities may include, e.g., magnesium (Mg).

A cathode of the Zener diode 131 may be electrically connected to the upper pad 112, and an anode of the Zener diode 131 may be electrically connected to the upper pad 113. The cathode of the Zener diode 131 may be connected to the upper pad 112 via the wirings 136, and the anode of the Zener diode 131 may be connected to the upper pad 113 by using any one of a soldering process or a eutectic bonding process.

The Zener diode 131 may be connected in parallel with the LED chip 120. The cathode of the Zener diode 131 may be substantially cut off from the anode of the LED chip 120, and the anode of the Zener diode 131 may be substantially cut off from the cathode of the LED chip 120. The Zener diode 131 may help prevent damage to the LED chip 120 due to a reverse direction current and electrostatic discharge (ESD).

In an implementation, the side surface molding layer 140 may include an insulating material. The side surface molding layer 140 may include silicone molding compound (SMC).

In an implementation, the side surface molding layer 140 may cover the upper surface 111U of the substrate 111, side surfaces of each of the upper pads 112 and 113, and side surfaces of each of the lower pads 114, 115, and 116. In an implementation, the side surface molding layer 140 may not cover an upper surface of each of the upper pads 112 and 113, and a lower surface of each of the lower pads 114, 115, and 116. In an implementation, the side surface molding layer 140 may be spaced apart from the upper surfaces of the upper pads 112 and 113 and the lower surfaces of the lower pads 114, 115, and 116.

In an implementation, a Z direction thickness of a portion of the side surface molding layer 140 between the upper pads 112 and 113 may be substantially equal to the Z direction thickness Z2 of the upper pads 112 and 113. In an implementation, a Z direction thickness of a portion of the side surface molding layer 140 between the lower pads 114, 115, and 116 may be substantially equal to the Z direction thickness Z3 of the lower pads 114, 115, and 116.

In an implementation, the side surface molding layer 140 may not cover the first through fourth side surfaces 111S1, 111S2, 111S3, and 111S4 of the substrate 111. In an implementation, the side surface molding layer 140 may expose the first through fourth side surfaces 111S1, 111S2, 111S3, and 111S4 of the substrate 111. In an implementation, the side surface molding layer 140 may be spaced apart from the first through fourth side surfaces 111S1, 111S2, 111S3, and 111S4 of the substrate 111. In an implementation, an outer side surface 140E of the side surface molding layer 140 may be coplanar with the first through fourth side surfaces 111S1, 111S2, 111S3, and 111S4 of the substrate 111.

In an implementation, the side surface molding layer 140 may include a cup portion 140C horizontally surrounding the LED chip 120 and the fluorescent layer 150. In an implementation, an upper surface 140CU of the cup portion 140C of the side surface molding layer 140 may be spaced farther apart from the substrate 111 than an upper surface 150U of the fluorescent layer 150. An internal surface 140CI of the cup portion 140C of the side surface molding layer 140 may be slanted or inclined in a direction away from the LED chip 120 (e.g., outwardly).

The fluorescent layer 150 may be on the LED chip 120. The fluorescent layer 150 may cover a light transmitting layer of the LED chip 120. In an implementation, the fluorescent layer 150 may help reduce a color distribution of light generated by the LED chip 120.

The fluorescent layer 150 may include, e.g., phosphor-in-glass (PiG). PiG may include a mixture of transparent glass and ceramic phosphor. PiG may have higher heat resistance and chemical resistance than other phosphor layers. Accordingly, the fluorescent layer 150 including PiG may help enhance reliability of the LED package 100 used in an environment exposed to a high temperature and moisture due to a high output of the LED chip 120.

The reflection molding layer 160 may fill a portion of a space defined by the cup portion 140C of the side surface molding layer 140. Accordingly, the reflection molding layer 160 may be horizontally surrounded by the cup portion 140C of the side surface molding layer 140. The reflection molding layer 160 may include an insulating material. The reflection molding layer 160 may include white silicon and titanium nitride (TiN) particles embedded in white silicon. The reflection molding layer 160 may reflect light generated by the LED chip 120, and enhance light extraction efficiency of the LED package 100.

In an implementation, an upper surface 160U of the reflection molding layer 160 may be slanted or inclined with respect to the upper surface 111U of the substrate 111. In an implementation, the upper surface 160U of the reflection molding layer 160 may be slanted to be lower (e.g., closer to the substrate 111 in the Z direction), when the upper surface 160U of the reflection molding layer 160 is horizontally closer in a direction from the cup portion 140C of the side surface molding layer 140 toward the fluorescent layer 150 (e.g., a central part of the reflection molding layer 160 may be closer to the substrate 111 in the Z direction than edge parts thereof). In an implementation, the upper surface 160U of the reflection molding layer 160 may be higher when the upper surface 160U of the reflection molding layer 160 is closer in a direction from the LED chip 120 toward the cup portion 140C of the side surface molding layer 140.

The upper surface 140CU of the cup portion 140C of the side surface molding layer 140 may be spaced farther apart from the substrate 111 than the upper surface 150U of the fluorescent layer 150 (e.g., in the Z direction), it is possible to form an upper surface slant of the upper surface 160U of the reflection molding layer 160 so that the upper surface 160U of the reflection molding layer 160 is higher closer to the cup portion 140C of the side surface molding layer 140.

In an implementation, the reflection molding layer 160 may cover the upper pads 112 and 113, the LED chip 120, the Zener diode 131, and the wirings 135 and 136. In an implementation, the reflection molding layer 160 may cover a portion of upper surfaces of the upper pads 112 and 113, portions of side surfaces and the upper surface 120U of the LED chip 120.

In an implementation, the reflection molding layer 160 may expose (e.g., may not cover) the upper surface 150U of the fluorescent layer 150. In an implementation, the reflection molding layer 160 may be spaced apart from the upper surface 150U of the fluorescent layer 150.

In an implementation, the reflection molding layer 160 may partially cover a side surface 150S of the fluorescent layer 150. In an implementation, the reflection molding layer 160 may cover a lower portion of the side surface 150S of the fluorescent layer 150 (e.g., proximate to the substrate 111 in the Z direction), and expose an upper portion of the side surface 150S of the fluorescent layer 150 (e.g., distal to the substrate 111 in the Z direction). In an implementation, the reflection molding layer 160 may contact (e.g., directly contact) the lower portion of the side surface 150S of the fluorescent layer 150.

In an implementation, the reflection molding layer 160 may expose a portion of the side surface 150S of the fluorescent layer 150. In an implementation, the reflection molding layer 160 may be spaced apart from a portion of the side surface 150S of the fluorescent layer 150.

In an implementation, a height 150EH of a portion exposed by the side surface 150S of the fluorescent layer 150 (e.g., a portion not covered by the reflection molding layer 160) may be in a range of 0.1% to 100% of a height 150H of the fluorescent layer 150 (as measured in the Z direction). In an implementation, when the height 150EH is about 100% of the height 150H of the fluorescent layer 150, the reflection molding layer 160 may not cover any of the side surfaces 150S of the fluorescent layer 150, and the side surface 150S of the fluorescent layer 150 may be entirely exposed.

In an implementation, the height 150EH may be equal to or greater than about 5% of the height 150H. In an implementation, the height 150EH may be equal to or greater than about 10% of the height 150H. In an implementation, the height 150EH may be equal to or greater than about 15% of the height 150H. In an implementation, the height 150EH may be equal to or greater than about 20% of the height 150H. In an implementation, the height 150EH may be equal to or greater than about 25% of the height 150H. In an implementation, the height 150EH may be equal to or greater than about 30% of the height 150H. In an implementation, the height 150EH may be equal to or greater than about 35% of the height 150H. In an implementation, the height 150EH may be equal to or greater than about 40% of the height 150H. In an implementation, the height 150EH may be equal to or greater than about 45% of the height 150H. In an implementation, the height 150EH may be equal to or greater than about 50% of the height 150H.

In an implementation, the height 150EH may be equal to or less than about 95% of the height 150H. In an implementation, the height 150EH may be equal to or less than about 90% of the height 150H. In an implementation, the height 150EH may be equal to or less than about 85% of the height 150H. In an implementation, the height 150EH may be equal to or less than about 80% of the height 150H. In an implementation, the height 150EH may be equal to or less than about 75% of the height 150H. In an implementation, the height 150EH may be equal to or less than about 70% of the height 150H. In an implementation, the height 150EH may be equal to or less than about 65% of the height 150H. In an implementation, the height 150EH may be equal to or less than about 60% of the height 150H. In an implementation, the height 150EH may be equal to or less than about 55% of the height 150H.

In an implementation, a height 150CH of a portion, covered by the reflection molding layer 160, of the side surface 150S of the fluorescent layer 150 may be in a range of 0% to 99.9% of the height 150CH of the fluorescent layer 150.

In an implementation, the height 150CH may be equal to or greater than about 5% of the height 150H. In an implementation, the height 150CH may be equal to or greater than about 10% of the height 150H. In an implementation, the height 150CH may be equal to or greater than about 15% of the height 150H. In an implementation, the height 150CH may be equal to or greater than about 20% of the height 150H. In an implementation, the height 150CH may be equal to or greater than about 25% of the height 150H. In an implementation, the height 150CH may be equal to or greater than about 30% of the height 150H. In an implementation, the height 150CH may be equal to or greater than about 35% of the height 150H. In an implementation, the height 150CH may be equal to or greater than about 40% of the height 150H. In an implementation, the height 150CH may be equal to or greater than about 45% of the height 150H.

In an implementation, the height 150CH may be equal to or less than about 95% of the height 150H. In an implementation, the height 150CH may be equal to or less than about 90% of the height 150H. In an implementation, the height 150CH may be equal to or less than about 85% of the height 150H. In an implementation, the height 150CH may be equal to or less than about 80% of the height 150H. In an implementation, the height 150CH may be equal to or less than about 75% of the height 150H. In an implementation, the height 150CH may be equal to or less than about 70% of the height 150H. In an implementation, the height 150CH may be equal to or less than about 65% of the height 150H. In an implementation, the height 150CH may be equal to or less than about 60% of the height 150H. In an implementation, the height 150CH may be equal to or less than about 55% of the height 150H. In an implementation, the height 150CH may be equal to or less than about 50% of the height 150H.

If the reflection molding layer 160 were to completely cover the side surfaces 150S of the fluorescent layer 150, a light emitting surface of the LED package 100 could be the same as an upper surface area of the fluorescent layer 150. If the upper surface of the fluorescent layer 150 has an X direction length 150X and a Y direction length 150Y, and the side surface 150S of the fluorescent layer 150 is completely covered by the reflection molding layer 160, the light emitting surface (hereinafter, LES) of an LED package may be obtained by Formula 1 below.

$$LES = 150X \cdot 150Y \quad \text{[Formula 1]}$$

In an implementation, the reflection molding layer 160 may partially expose the side surfaces 150S of the fluorescent layer 150, and the light generated by the LED chip 120 may be emitted more from the side surfaces 150S exposed by the upper surface 150U of the fluorescent layer 150. The LES of the LED package 100 according to example embodiments may be obtained by Formula 2 below.

$$LES = 150X \cdot 150Y + 2(150X + 150Y) \cdot 150EH \quad \text{[Formula 2]}$$

In an implementation, the LES of the LED package 100 may be increased, and accordingly, the LED package 100 having enhanced light extraction efficiency may be provided.

Light extraction efficiency of an LED package with the height 150EH as about 40% of the height 150H may be improved by approximately about 2% from light extraction efficiency of a comparative LED package, in which the height 150EH is about 0% of the height 150H (e.g., in which the side surfaces 150S of the fluorescent layer 150 are completely covered by the reflection molding layer 160).

Figure 3A:
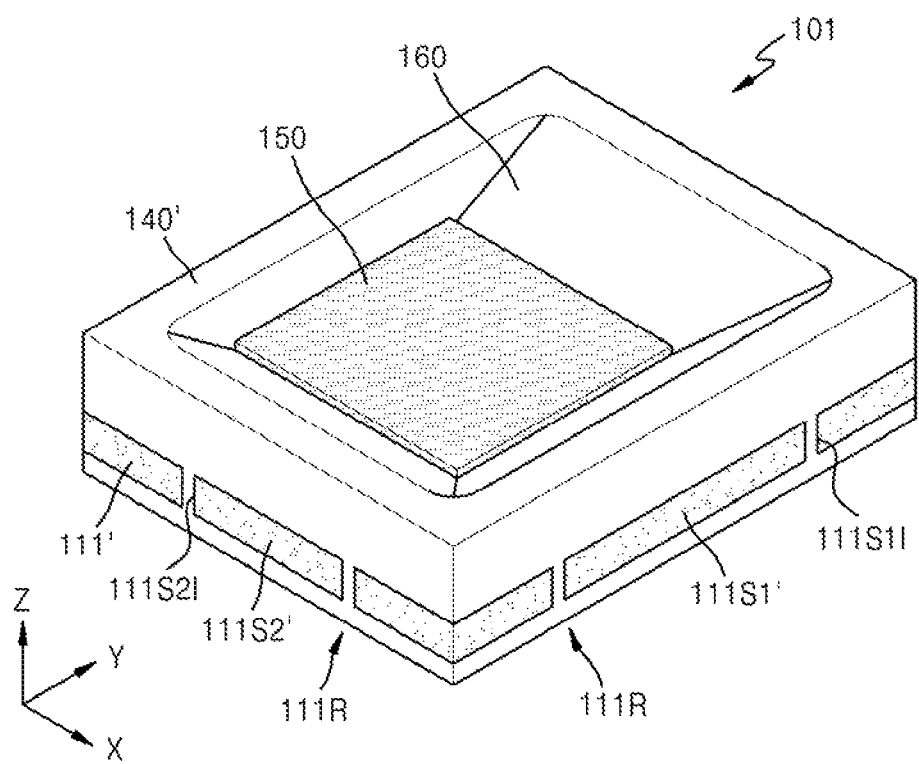
FIGS. 3A and 3B are perspective views of an LED package according to other example embodiments.

FIG. 3A is a perspective view of an LED package 101 according to another example embodiment.

Figure 3B:
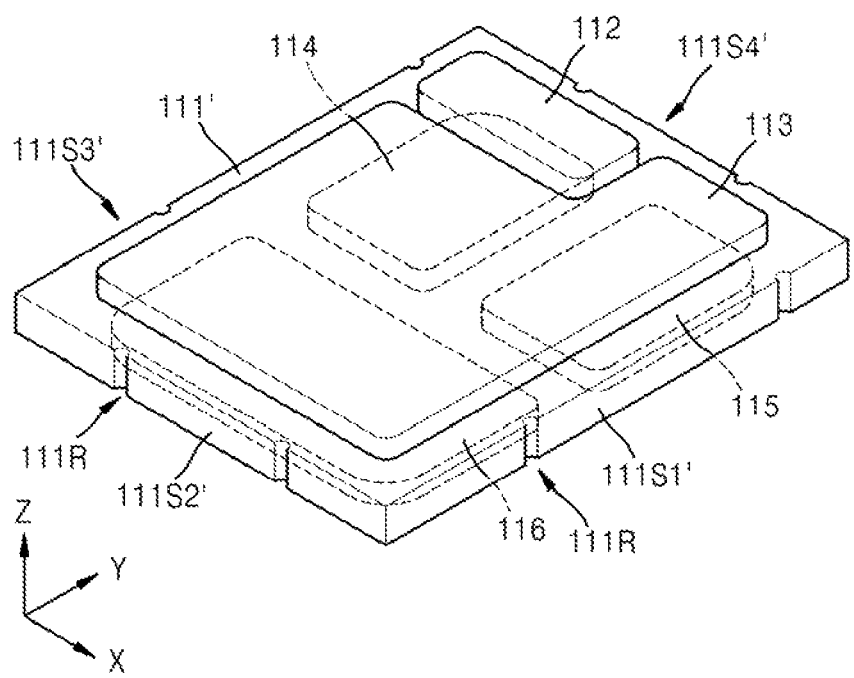

FIG. 3B is a perspective view of a substrate 111', the upper pads 112 and 113, and the lower pads 115 and 116 of the LED package 101.

Figure 3C:
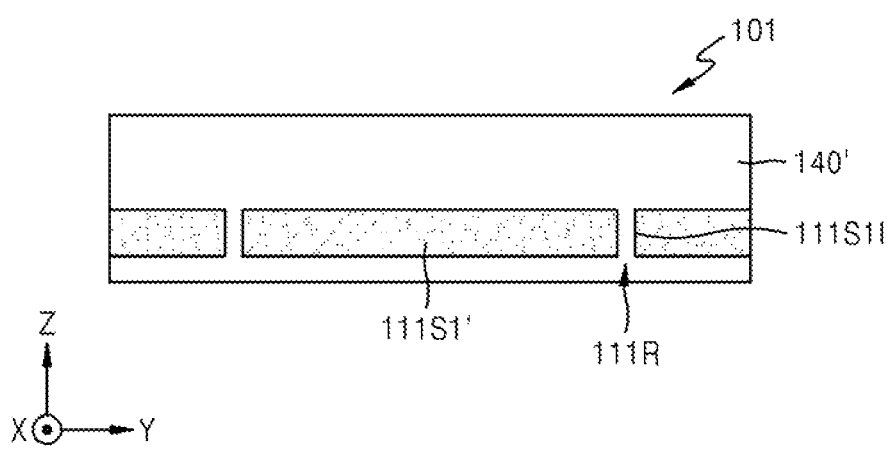
FIG. 3C is a side view of the LED package of FIG. 3A.

FIG. 3C is a side view of the LED package 101 of FIG. 3A.

Referring to FIGS. 3A through 3C, the LED package 101 may include the substrate 111', the upper pads 112 and 113, the lower pads (see 114, 115, and 116 in FIG. 2C), the LED chip (see 120 in FIG. 2D), the Zener diode (see 131 in FIG. 2D), the wirings (see 135 and 136 in FIG. 2D), a side surface molding layer 140', the fluorescent layer 150, and the reflection molding layer 160.

The upper pads 112 and 113, the lower pads (see 114, 115, and 116 in FIG. 2C), the LED chip (refer to 120 in FIG. 2D), the Zener diode (see 131 in FIG. 2D), the wirings (see 135 and 136 in FIG. 2D), the fluorescent layer 150, and the reflection molding layer 160 are substantially the same as those described with reference to FIGS. 1A through 2D, and thus, repeated descriptions thereof may be omitted.

The substrate 111' may include an upper surface vertical to the Z direction, a lower surface vertical to the Z direction, a first side surface 111S1' vertical to the X direction, a second side surface 111S2' vertical to the Y direction, a third side surface 111S3' vertical to the X direction, and a fourth side surface 111S4' vertical to the Y direction.

The substrate 111' may be generally similar to the substrate 111 described with reference to FIGS. 1A through 2D, except for that recesses 111R may be formed in the first through fourth side surfaces 111S1', 111S2', 111S3', and 111S4', and corner portions are not removed.

In an implementation, the recesses 111R may be halves of circular holes (e.g., semicircular). In an implementation, the recesses 111R may be formed by separating holes for injecting a molding material in a molding process for forming the side surface molding layer 140' of the LED package 101.

In an implementation, the first and second side surfaces 111S1' and 111S2' may include internal surfaces 111S1I and 111S2I, which define the recesses 111R, respectively. In an implementation, the third and fourth side surfaces 111S3' and 111S4' may also include internal surfaces defining the recesses 111R. In an implementation, a shape of each of the upper surface and the lower surface of the substrate 111' may have a rectangular shape, in which concave portions thereof are formed on or at edges.

In an implementation, the side surface molding layer 140' may be substantially the same as the side surface molding layer 140 described with reference to FIGS. 1A through 2D, except for also filling the recesses 111R so that the side surface molding layer 140' is coplanar with the first through fourth side surfaces 111S1', 111S2', 111S3', and 111S4' of the substrate 111'.

Figure 4A:
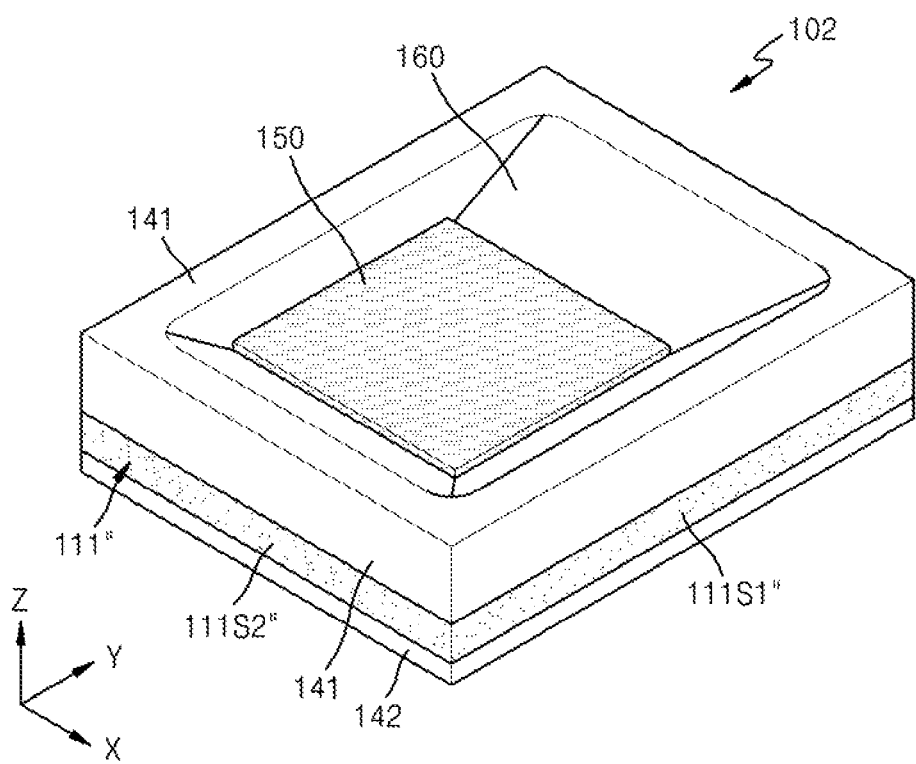
FIG. 4A is a perspective view of an LED package according to another example embodiment.

FIG. 4A is a perspective view of an LED package 102 according to another example embodiment.

Figure 4B:
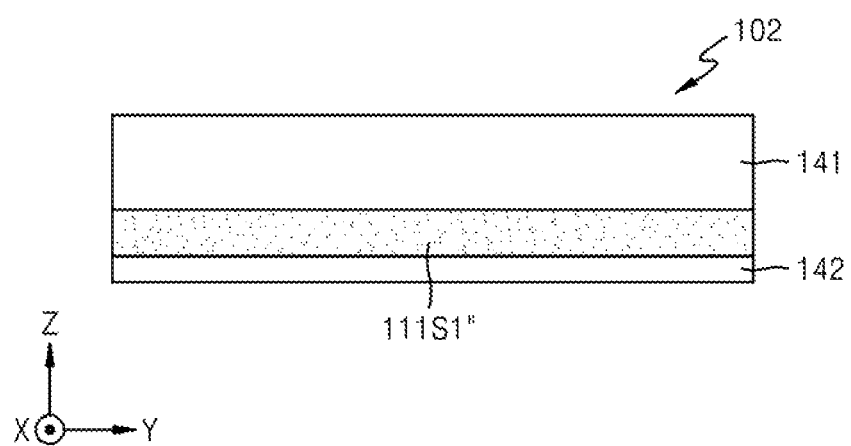
FIG. 4B is a side view of the LED package of FIG. 4A.

FIG. 4B is a side view of the LED package 102 of FIG. 4A.

Referring to FIGS. 4A and 4B, the LED package 102 may include the substrate 111", the upper pads (see 112 and 113 in FIG. 1C), the lower pads (see 114, 115, and 116 in FIG. 2C), the LED chip (see 120 in FIG. 2D), the Zener diode (see 131 in FIG. 2D), the wirings (see 135 and 136 in FIG. 2D), a side surface molding layer 141, a lower molding layer 142, the fluorescent layer 150, and the reflection molding layer 160.

The upper pads (see 112 and 113 in FIG. 1C), the lower pads (see 114, 115, and 116 in FIG. 2C), the LED chip (see 120 in FIG. 2D), the Zener diode (see 131 in FIG. 2D), the wirings (see 135 and 136 in FIG. 2D), the fluorescent layer 150, and the reflection molding layer 160 may be substantially the same as those described with reference to FIGS. 1A through 2D, and thus, repeated descriptions thereof may be omitted.

In an implementation, the side surface molding layer 141 may be substantially the same as a portion of the side surface molding layer 140 in FIGS. 1A through 2D, which is on the upper surface 111U of the substrate 111. In an implementation, the lower molding layer 142 may be substantially the same as a portion of the side surface molding layer 140 in FIGS. 1A through 2D, which is on the lower surface 111B of the substrate 111.

The substrate 111" may, unlike the substrate 111 in FIGS. 1A through 2D, not include removed corner portions. Accordingly, the side surface molding layer 141 may be separated from the lower molding layer 142. The side surface molding layer 141 and the lower molding layer 142 may be spaced apart from each other (e.g., in the Z direction) with the substrate 111" therebetween. Accordingly, outer side surfaces of the side surface molding layer 141 and the lower molding layer 142 may be coplanar with the first through fourth side surfaces 111S1", 111S2", 111S3", and 111S4". In an implementation, the side surface molding layer 141 and the lower molding layer 142 may be provided by using separate molding processes.

Figure 5A:
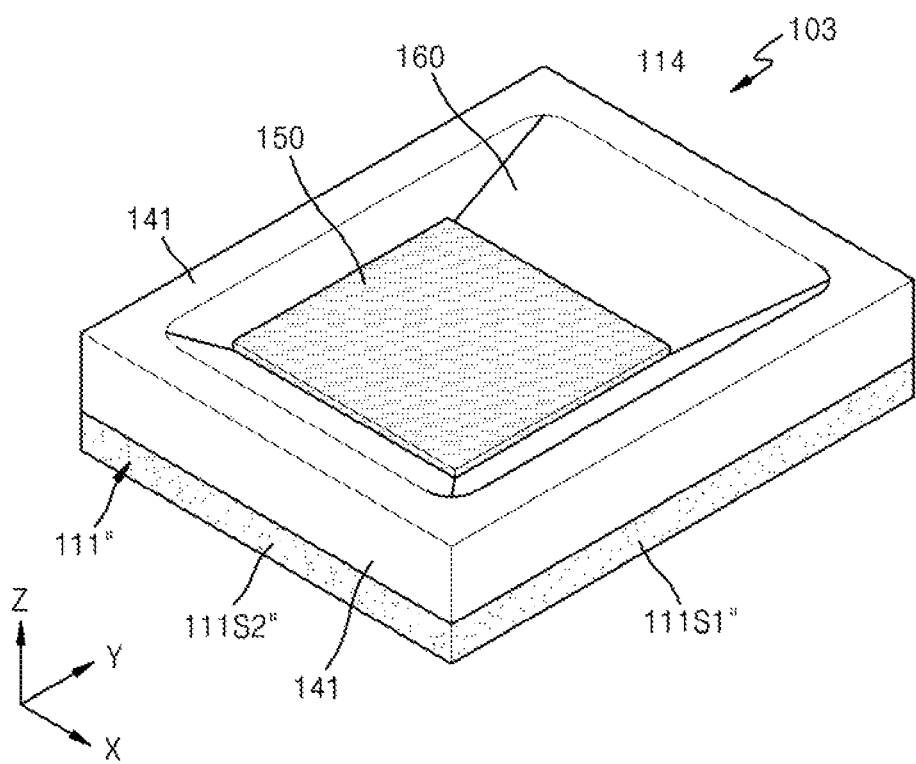
FIG. 5A is a perspective view of an LED package according to another example embodiment.

FIG. 5A is a perspective view of an LED package 103 according to another example embodiment.

Figure 5B:
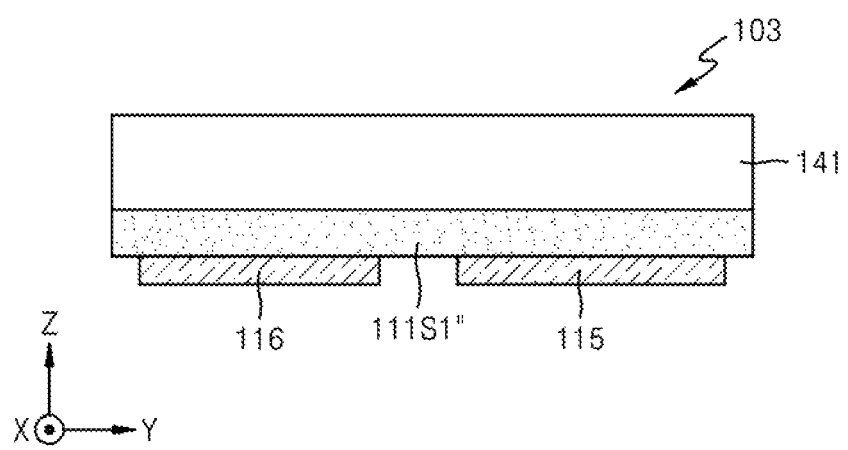
FIG. 5B is a side view of the LED package of FIG. 5A.

FIG. 5B is a side view of the LED package 103 of FIG. 5A.

Referring to FIGS. 5A and 5B, the LED package 103 may include the substrate 111", the upper pads (see 112 and 113 in FIG. 1C), the lower pads (see 114, 115, and 116 in FIG. 2C), the LED chip (see 120 in FIG. 2D), the Zener diode (see 131 in FIG. 2D), the wirings (see 135 and 136 in FIG. 2D), a side surface molding layer 141, the fluorescent layer 150, and the reflection molding layer 160.

The upper pads (see 112 and 113 in FIG. 1C), the lower pads (see 114, 115, and 116 in FIG. 2C), the LED chip (see 120 in FIG. 2D), the Zener diode (see 131 in FIG. 2D), the wirings (see 135 and 136 in FIG. 2D), the fluorescent layer 150, and the reflection molding layer 160 may be substantially the same as those described with reference to FIGS. 1A through 2D, and thus, repeated descriptions thereof may be omitted.

In an implementation, the substrate 111" and the side surface molding layer 141 may be substantially the same as those described with reference to FIGS. 4A and 4B. In an implementation, the LED package 103 may not include the lower molding layer 142, and accordingly, the lower pads (see 114, 115, and 116 in FIG. 2C) may be exposed.

Figure 6A:
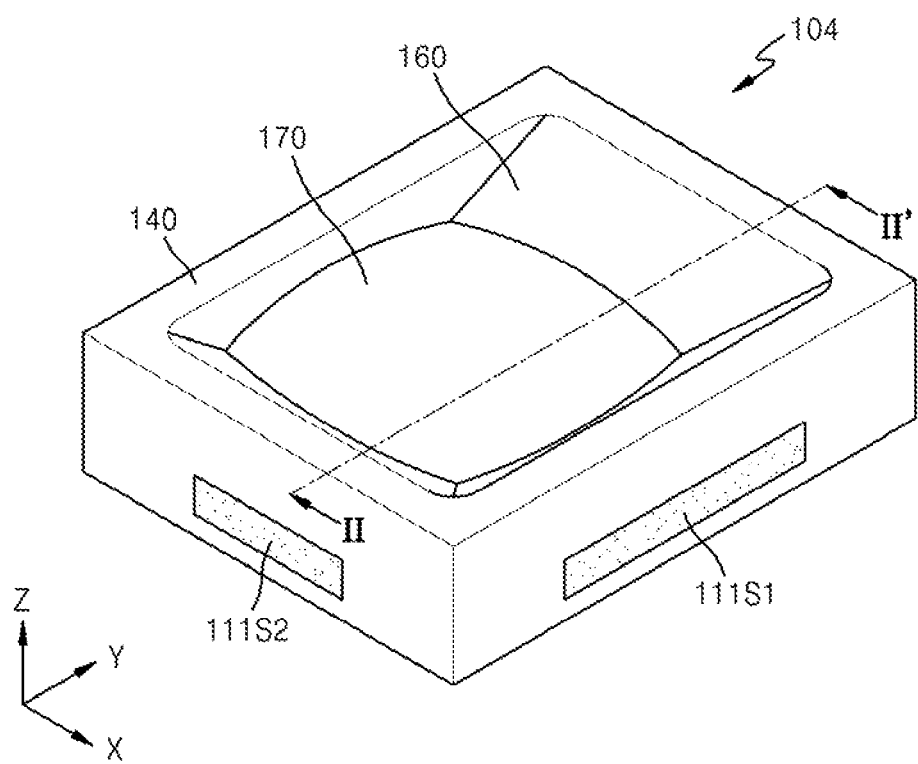
FIG. 6A is a perspective view of an LED package according to an example embodiment.

FIG. 6A is a perspective view of an LED package 104 according to another example embodiment.

Figure 6B:
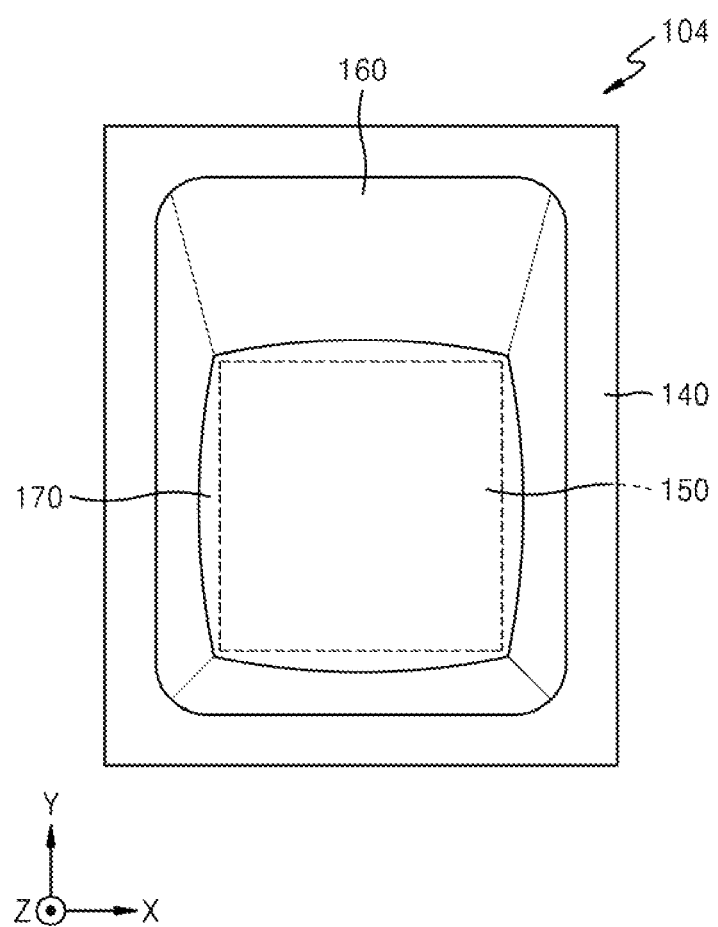
FIG. 6B is a top view of an LED package according to an example embodiment.

FIG. 6B is a top view of the LED package 104 according to an example embodiment.

Figure 6C:
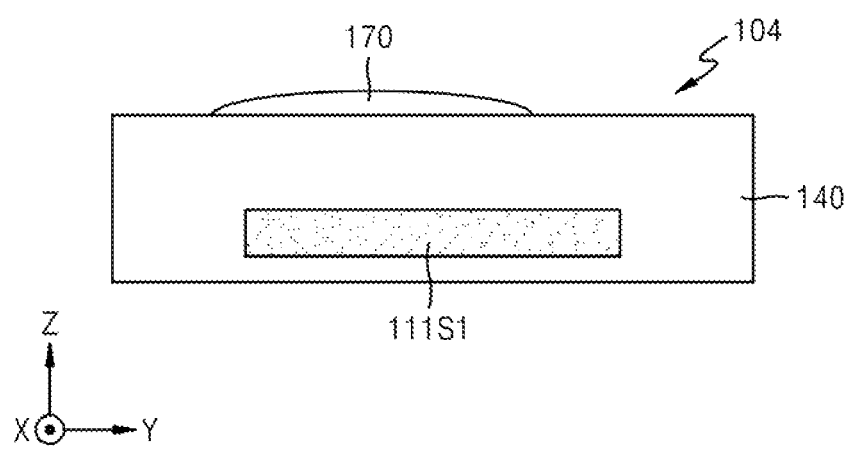
FIG. 6C is a side view of an LED package according to an example embodiment.

FIG. 6C is a side view of the LED package 104 according to an example embodiment.

Figure 6D:
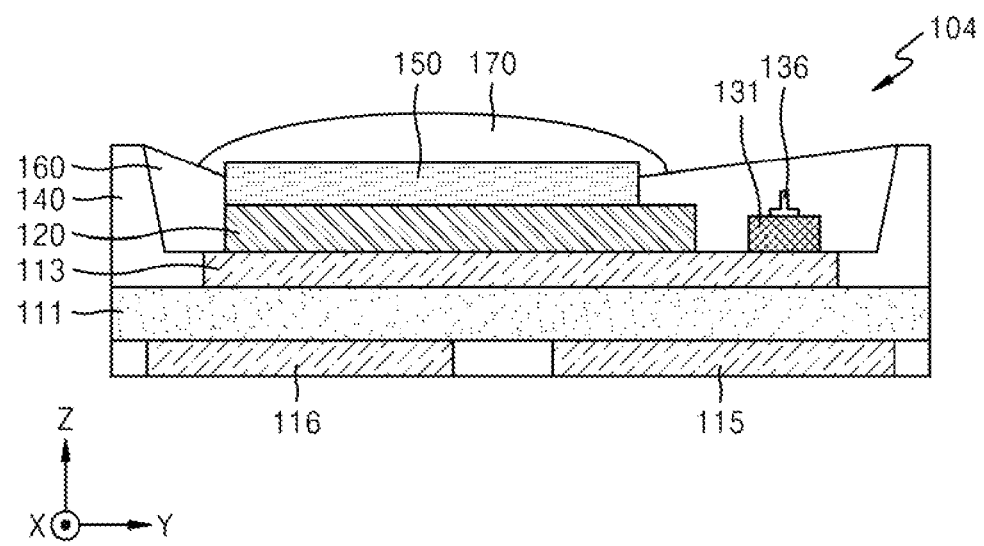
FIG. 6D is a cross-sectional view taken along line in FIG. 6A.

FIG. 6D is a cross-sectional view taken along line II-II' in FIG. 6A.

Referring to FIGS. 6A and 6B, the LED package 104 may include the substrate 111, the upper pads (see 112 and 113 in FIG. 1C), the lower pads (see 114, 115, and 116 in FIG. 2C), the LED chip 120, the Zener diode 131, the wirings (see 135 and 136 in FIG. 2D), the side surface molding layer 140, the fluorescent layer 150, the reflection molding layer 160, and a cell lens 170.

The substrate 111, the upper pads (see 112 and 113 in FIG. 1C), the lower pads (see 114, 115, and 116 in FIG. 2C), the LED chip 120, the Zener diode 131, the wirings (see 135 and 136 in FIG. 2D), the side surface molding layer 140, the fluorescent layer 150, and the reflection molding layer 160 may be substantially the same as those described with reference to FIGS. 1A through 2D, and thus, repeated descriptions thereof may be omitted.

In an implementation, the cell lens 170 may change light distribution characteristics of the LED package 100. In an implementation, the cell lens 170 may help improve light extraction efficiency of the LED package 100, by refracting light directed outside an intended orientation angle. In an implementation, light extraction efficiency of the LED package 104 may be improved by about 3% due to forming of the cell lens 170.

In an implementation, the cell lens 170 may include a convex lens. In an implementation, the cell lens 170 may cover portions of the fluorescent layer 150 and the reflection molding layer 160. In an implementation, the cell lens 170 may entirely cover the fluorescent layer 150. In an implementation, an area of the cell lens 170 may be greater than an area of the fluorescent layer 150. In an implementation, a light axis of the cell lens 170 may pass through a horizontal center of the fluorescent layer 150 (e.g., the center in the X direction and the Y direction).

Figure 7A:
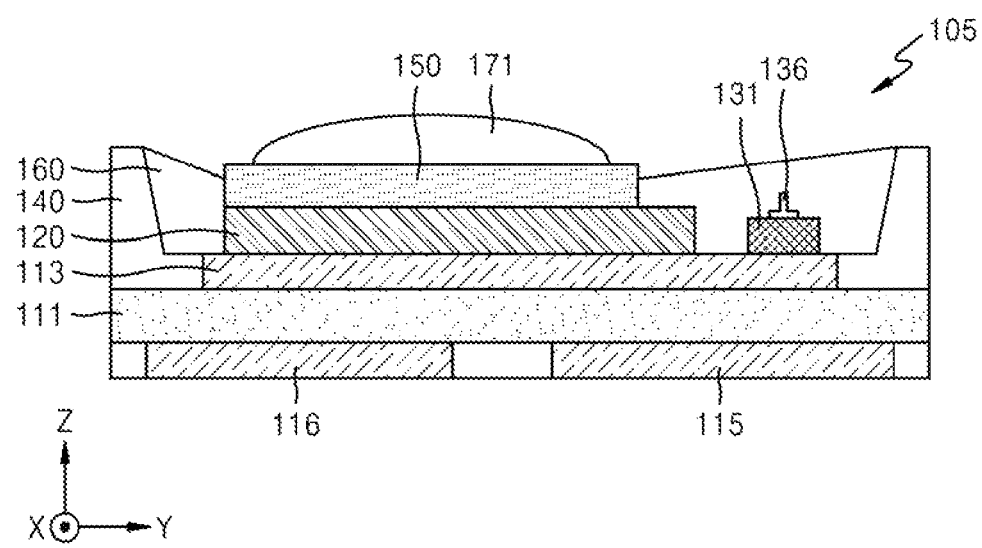
FIG. 7A is a cross-sectional view of an LED package according to an example embodiment.

FIG. 7A is a cross-sectional view of an LED package 105 according to an example embodiment, and illustrates a portion corresponding to FIG. 6D.

Referring to FIG. 7A, the LED package 105 may include the substrate 111, the upper pads (see 112 and 113 in FIG. 1C), the lower pads (see 114, 115, and 116 in FIG. 2C), the LED chip 120, the Zener diode 131, the wirings (see 135 and 136 in FIG. 2D), the side surface molding layer 140, the fluorescent layer 150, the reflection molding layer 160, and a cell lens 171.

The substrate 111, the upper pads (see 112 and 113 in FIG. 1C), the lower pads (see 114, 115, and 116 in FIG. 2C), the LED chip 120, the Zener diode 131, the wirings (see 135 and 136 in FIG. 2D), the side surface molding layer 140, the fluorescent layer 150, and the reflection molding layer 160 may be substantially the same as those described with reference to FIGS. 1A through 2D, and thus, repeated descriptions thereof may be omitted.

In an implementation, the cell lens 171 may be similar to the cell lens 170 in FIG. 6D, but may cover only a portion of (e.g., the top surface of) the fluorescent layer 150. In an implementation, the cell lens 171 may not cover the reflection molding layer 160. In an implementation, the cell lens 171 may not vertically (e.g., in the Z direction) overlap the reflection molding layer 160. In an implementation, an area of the cell lens 171 may be less than an area of the fluorescent layer 150.

Figure 7B:
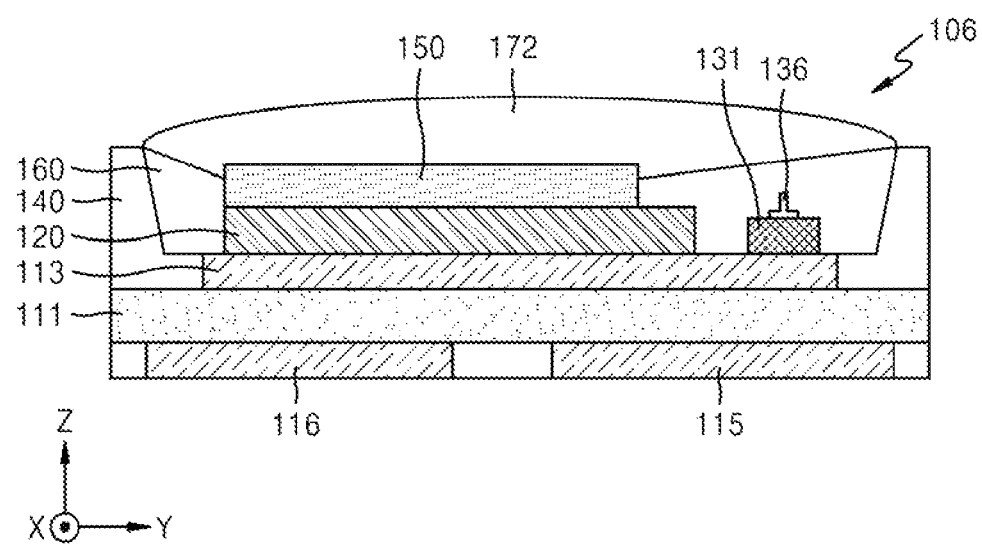
FIG. 7B is a cross-sectional view of an LED package according to an example embodiment.

FIG. 7B is a cross-sectional view of an LED package 106 according to an example embodiment, and illustrates a portion corresponding to FIG. 6D.

Referring to FIG. 7B, the LED package 106 may include the substrate 111, the upper pads (see 112 and 113 in FIG. 1C), the lower pads (see 114, 115, and 116 in FIG. 2C), the LED chip 120, the Zener diode 131, the wirings (see 135 and 136 in FIG. 2D), the side surface molding layer 140, the fluorescent layer 150, the reflection molding layer 160, and a cell lens 172.

The substrate 111, the upper pads (see 112 and 113 in FIG. 1C), the lower pads (see 114, 115, and 116 in FIG. 2C), the LED chip 120, the Zener diode 131, the wirings (see 135 and 136 in FIG. 2D), the side surface molding layer 140, the fluorescent layer 150, and the reflection molding layer 160 may be substantially the same as those described with reference to FIGS. 1A through 2D, and thus, repeated descriptions thereof may be omitted.

In an implementation, the cell lens 172 may be similar to the cell lens 170 in FIG. 6D, but may entirely cover the fluorescent layer 150 and the reflection molding layer 160.

Figure 8:
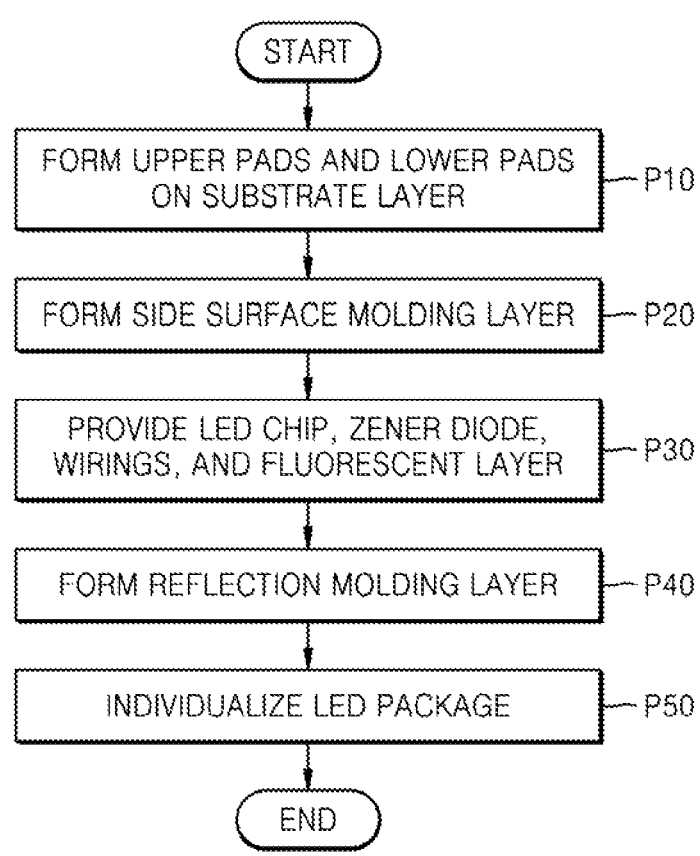
FIG. 8 is a flowchart of a method of fabricating an LED package, according to an example embodiment.

FIG. 8 is a flowchart of a method of fabricating an LED package, according to an example embodiment.

FIGS. 9A through 9E are cross-sectional views for describing a method of fabricating an LED package, according to example embodiments.

Figure 9A:
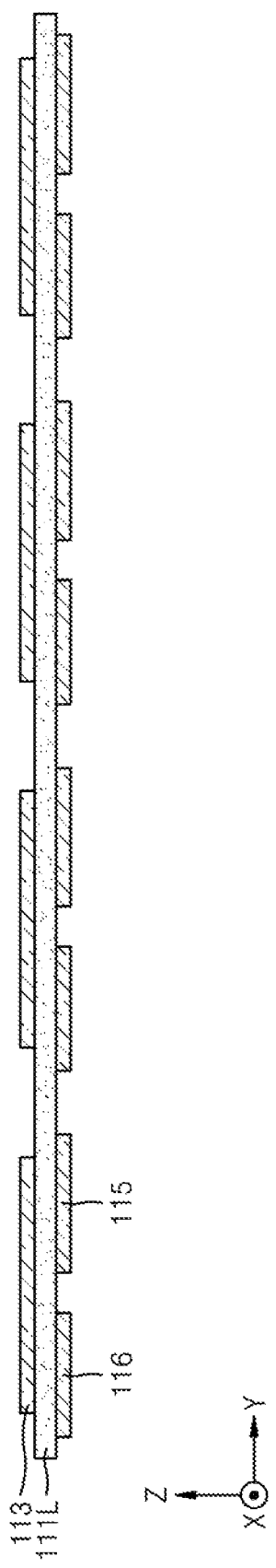
FIGS. 9A through 9E are cross-sectional views of stages in a method of fabricating an LED package, according to example embodiments.

Referring to FIGS. 1C, 8, and 9A, the upper pads 112 and 113 and the lower pads 114, 115, and 116 may be formed on a substrate layer 111L (P10). The substrate layer 111L may provide a base for forming the LED package (see 100 of FIG. 1), before being separated. The substrate layer 111L may include a large-area substrate for simultaneously fabricating a plurality of LED packages (see 100 of FIG. 1).

Figure 9B:
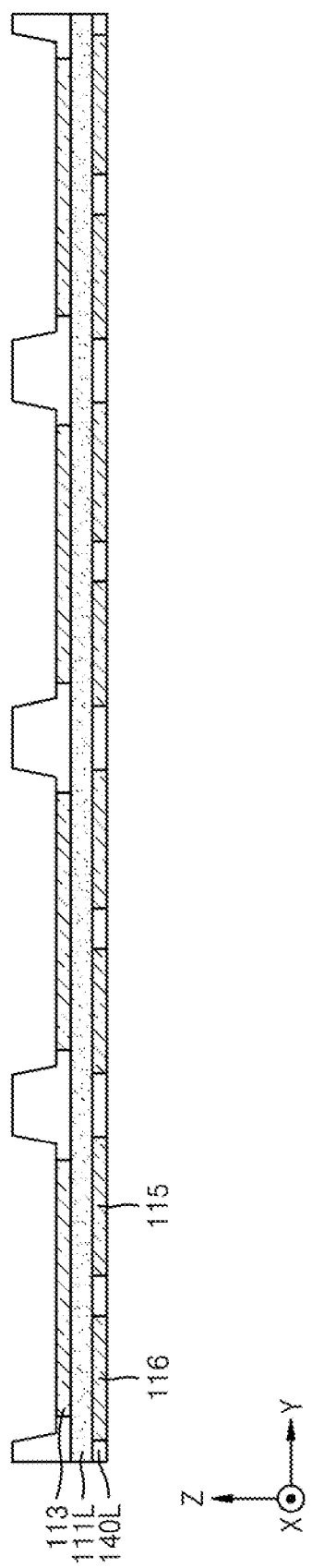

Next, referring to FIGS. 8 and 9B, a side surface molding layer 140L may be formed (P20). In an implementation, the side surface molding layer 140L may cover side surfaces of the upper pads (see 112 and 113 in FIG. 1C) and expose the upper surfaces thereof, and may cover side surfaces of the lower pads (see 114, 115, and 116 in FIG. 1C) and expose the upper surfaces thereof.

The side surface molding layer 140L may horizontally surround the upper pads (see 112 and 113 in FIG. 1C), and may include a cup portion, which protrudes from the upper surface of the substrate layer 111L with respect to the upper pads (see 112 and 113 in FIG. 1C). The cup portion of the side surface molding layer 140L may be for forming the cup portion 140C of the side surface molding layer (see 140 in FIG. 2D).

Figure 9C:
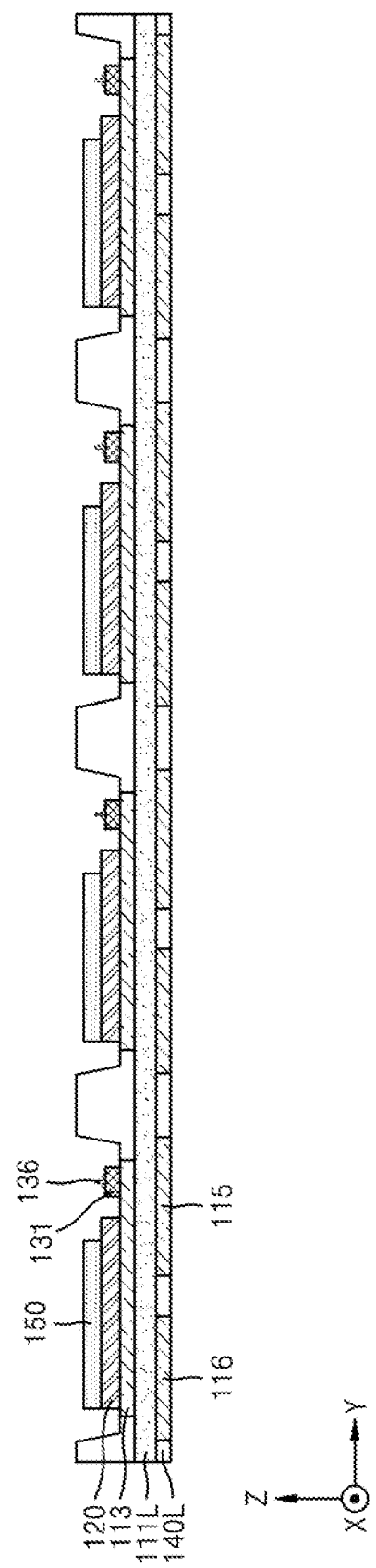

Referring to FIGS. 1B, 8, and 9C, the LED chip 120, the Zener diode 131, the wirings 135 and 136, and the fluorescent layer 150 may be provided (P30). In an implementation, the LED chip 120 and the Zener diode 131 may be provided by using surface mounting technique.

Figure 9D:
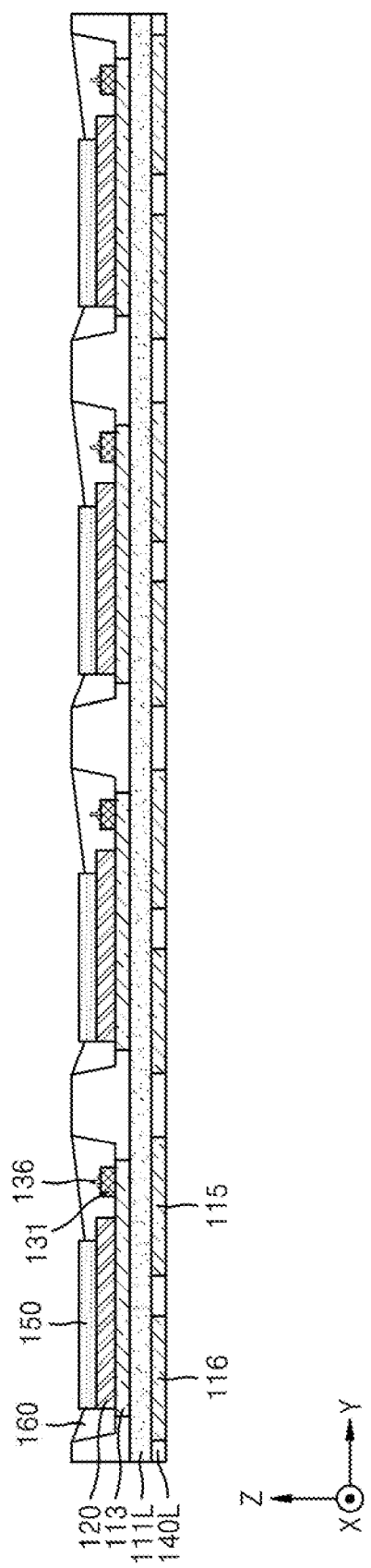

Referring to FIGS. 8 and 9D, the reflection molding layer 160 may be formed (P40). The reflection molding layer 160 may fill a space defined by the cup portion of the side surface molding layer 140L. The reflection molding layer 160 may be formed by using, e.g., a dispensing process or a dotting process using white silicon. In an implementation, by providing a small amount of white silicon as the upper surface of the reflection molding layer 160 approaches from the side surface molding layer 140L to the fluorescent layer 150, the upper surface of the reflection molding layer 160 may be slanted to be lower as the upper surface of the reflection molding layer 160 is closer to the fluorescent layer 150.

Figure 9E:
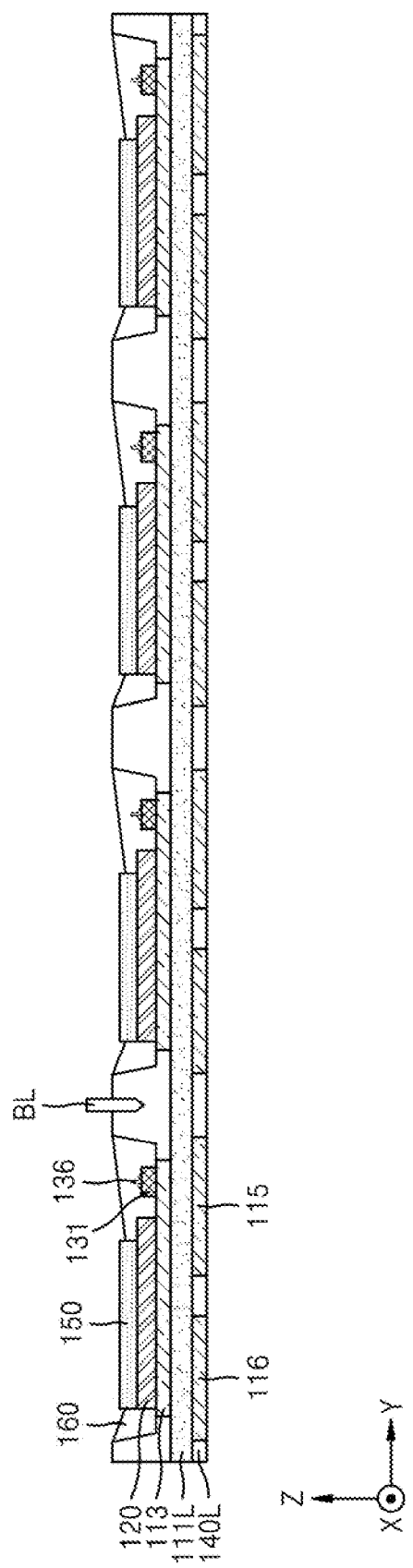

Next, referring to FIGS. 1A, 8, and 9E, the LED package 100 may be individualized. In an implementation, by cutting the side surface molding layer 140L and the substrate layer 111L by using a blade BL, the LED packages 100 may be individualized.

By way of summation and review, when LED packages are used as a light source in a vehicle, reliability of light extraction efficiency and operation of the LED packages may be very important from the standpoint of safety and the like. In addition, LED packages used as a light source in a vehicle may operate with a higher output than other LED packages, and an efficient heat dissipation design thereof may be important.

One or more embodiments may provide a light-emitting diode (LED) package having improved light extraction efficiency and reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A light-emitting diode (LED) package, comprising:
    a substrate including an insulating material;
    upper pads on an upper surface of the substrate;
    a side surface molding layer covering the upper surface of the substrate and side surfaces of the upper pads;
    an LED chip on the upper surface of the substrate and electrically connected to the upper pads;
    a fluorescent layer on the LED chip; and a reflection molding layer on the substrate and covering the LED chip, the reflection molding layer including white silicon, wherein the reflection molding layer exposes a portion of side surfaces of the fluorescent layer, wherein the reflection molding layer has an upper surface configured to reflect light emitted from the exposed portion of the side surfaces of the fluorescent layer, and wherein an uppermost portion of the upper surface of the reflection molding layer is farther from the upper surface of the substrate in a vertical direction than an upper surface of the fluorescent layer.

2. The LED package as claimed in claim 1, wherein as the upper surface of the reflection molding layer is inclined with respect to the upper surface of the substrate.

3. The LED package as claimed in claim 2, wherein the inclined upper surface of the reflection molding layer has a structure in which a portion of the upper surface of the reflection molding layer distal to the LED chip is farther from the upper surface of the substrate in the vertical direction than a portion of the upper surface of the reflection molding layer proximate to the LED chip is from the upper surface of the substrate in the vertical direction.

4. The LED package as claimed in claim 1, wherein the side surface molding layer includes a cup portion horizontally surrounding the LED chip and the fluorescent layer.

5. The LED package as claimed in claim 4, wherein an upper surface of the cup portion is spaced farther apart from the substrate in the vertical direction than the upper surface of the fluorescent layer is from the substrate in the vertical direction.

6. The LED package as claimed in claim 4, wherein an internal surface of the side surface molding layer that faces the LED chip is outwardly inclined with respect to the upper surface of the substrate.

7. The LED package as claimed in claim 1, wherein:
a lower portion of the fluorescent layer is covered by the reflection molding layer, and
an upper portion of the fluorescent layer is spaced apart from the reflection molding layer.

8. The LED package as claimed in claim 1, wherein a height of the portion of the fluorescent layer exposed by the reflection molding layer is in a range of 0.1% to 100% of a total height of the fluorescent layer.

9. The LED package as claimed in claim 1, wherein a portion of light generated by the LED chip is emitted from the side surfaces of the fluorescent layer to an outside of the LED package.

10. A light-emitting diode (LED) package, comprising:
a substrate;
lower pads on a lower surface of the substrate;
upper pads on an upper surface of the substrate;
an LED chip on the upper surface of the substrate and electrically connected to the upper pads;
a fluorescent layer on the LED chip;
a reflection molding layer on the substrate and covering the LED chip, the reflection molding layer including white silicon; and
a side surface molding layer covering a portion of the upper surface of the substrate, side surfaces of the upper pads, and side surfaces of the lower pads, the side surface molding layer including a cup portion horizontally surrounding the LED chip, the fluorescent layer, and the reflection molding layer,
wherein the reflection molding layer exposes a portion of side surfaces of the fluorescent layer, wherein the reflection molding layer has an upper surface configured to reflect light emitted from the exposed portion of the side surfaces of the fluorescent layer, wherein an uppermost portion of the upper surface of the reflection molding layer is farther from the upper surface of the substrate in a vertical direction than an upper surface of the fluorescent layer, wherein an upper surface of the cup portion is farther from the substrate in the vertical direction than the upper surface of the fluorescent layer is from the substrate in the vertical direction, and wherein an internal surface of the side surface molding layer that faces the LED chip is outwardly inclined with respect to the upper surface of the substrate.

11. The LED package as claimed in claim 10, wherein a thickness of each of the upper pads and the lower pads is in a range of 0.06 mm to 0.15 mm.

12. The LED package as claimed in claim 11, wherein a thickness of the substrate is in a range of 0.1 mm to 0.2 mm.

13. The LED package as claimed in claim 10, wherein the upper surface and the lower surface of the substrate have a shape of a rectangle in which corners thereof are inwardly recessed.

14. The LED package as claimed in claim 10, wherein the upper surface and the lower surface of the substrate have a rectangular shape having concave recesses at edges thereof.

15. The LED package as claimed in claim 10, wherein outer side surfaces of the side surface molding layer are coplanar with side surfaces of the substrate.

16. A light-emitting diode (LED) package, comprising:
a substrate including aluminum oxide;
upper pads on an upper surface of the substrate;
an LED chip on the upper surface of the substrate and electrically connected to the upper pads;
a fluorescent layer on the LED chip, the fluorescent layer including phosphor-in-glass (PiG);
a side surface molding layer covering a portion of the upper surface of the substrate and side surfaces of the upper pads, the side surface molding layer including a cup portion horizontally surrounding the LED chip and the fluorescent layer; and
a reflection molding layer covering the LED chip and inside surfaces of the cup portion of the side surface molding layer, the reflection molding layer exposing a portion of side surfaces of the fluorescent layer, wherein the reflection molding layer has an upper surface configured to reflect light emitted from the exposed portion of the side surfaces of the fluorescent layer, wherein the upper surface of the reflection molding layer is inclined with respect to the upper surface of the substrate such that the inclined upper surface of the reflection molding layer has a structure in which a portion of the upper surface of the reflection molding layer distal to the LED chip is farther from the upper surface of the substrate in a vertical direction than a portion of the upper surface of the reflection molding layer proximate to the LED chip is from the upper surface of the substrate in the vertical direction, and wherein an uppermost portion of the upper surface of the reflection molding layer is farther from the upper surface of the substrate in the vertical direction than an upper surface of the fluorescent layer.

17. The LED package as claimed in claim 16, further comprising a cell lens on the fluorescent layer.

18. The LED package as claimed in claim 17, wherein an area of the cell lens is greater than an area of the fluorescent layer.

19. The LED package as claimed in claim 17, wherein an area of the cell lens is less than an area of the fluorescent layer.

20. The LED package as claimed in claim 17, wherein the cell lens entirely covers the fluorescent layer and the reflection molding layer.

* * * * *